United States Patent [19]
Knauer et al.

[11] 4,131,810
[45] Dec. 26, 1978

[54] OPTO-ELECTRONIC SENSOR

[75] Inventors: Karl Knauer, Gauting; Hans-Joerg Pfleiderer, Zorneding, both of Germany

[73] Assignee: Siemens Aktiengesellschaft, Berlin & Munich, Germany

[21] Appl. No.: 694,836

[22] Filed: Jun. 10, 1976

[30] Foreign Application Priority Data

Jun. 20, 1975 [DE] Fed. Rep. of Germany ....... 2527657

[51] Int. Cl.² ...................... H03K 3/42; G11C 19/28; H01L 29/78; H01L 27/14
[52] U.S. Cl. ............................. 307/311; 307/221 D; 357/24; 357/30
[58] Field of Search ........................ 357/23, 24, 30, 31; 250/211 J; 307/221 D, 311

[56] References Cited

U.S. PATENT DOCUMENTS

| | | | |
|---|---|---|---|
| 3,576,392 | 4/1971 | Hofstein | 357/31 |
| 3,686,644 | 8/1972 | Christensen | 357/23 |
| 3,771,149 | 11/1973 | Collins et al. | 357/24 |
| 3,789,267 | 1/1974 | Krambeck et al. | 357/24 |
| 3,792,197 | 4/1971 | Chai | 357/31 |
| 3,796,927 | 3/1974 | Boyle et al. | 357/24 |
| 3,863,065 | 1/1975 | Kosonocky et al. | 357/24 |
| 3,896,485 | 7/1975 | Early | 357/24 |
| 3,906,543 | 9/1975 | Smith et al. | 357/24 |
| 3,996,600 | 12/1976 | Patrin | 357/24 |

OTHER PUBLICATIONS

Sequin, "Blooming Suppression in Charge Coupled Area Imaging Devices," Bell System Tech. Journal, vol. 51, (Oct. 1972), pp. 1923–1926.

*Primary Examiner*—William D. Larkins
*Assistant Examiner*—Gene M. Munson
*Attorney, Agent, or Firm*—Hill, Gross, Simpson, Van Santen, Steadman, Chiara & Simpson

[57] ABSTRACT

An opto-electronic sensor has a light-permeable electrically insulating layer arranged on a thin layer of doped semiconductor material having at least one connection contact to form a charge-coupled transmission device including at least one row of electrodes carried on the light-permeable, electrically insulating layer, the electrodes being separated from one another by gaps. The entire rear surface of the thin layer of doped semiconductor material carries at least one light-permeable, electrically insulating layer which, over the entire area thereof, carries a rear electrode consisting of light-permeable, electrically conductive material.

6 Claims, 4 Drawing Figures

OPTO-ELECTRONIC SENSOR

BACKGROUND OF THE INVENTION

Field of the Invention

The present invention relates to an opto-electronic sensor, in which on a surface of a thin layer of doped semiconductor material having at least one connection contact is arranged at least one light-permeable, electrically insulating layer which, corresponding to a charge coupled transmission device, bears at least one row of electrodes which are separated from each other by gaps.

Description of the Prior Art

A sensor of the type generally described above is operated in such a manner that its surface is exposed to light, and that under specific electrodes, potential wells for the charge carriers produced by the light are produced by connecting appropriate voltages to these electrodes. The charge carriers produced by the light accumulate in these potential wells. The accumulated charges are then read out by connecting pulse train voltages to the electrodes of the row. One may refer to the article "Charge-Coupled Digital Circuits" by W. F. Kosonocki and J. E. Carnes in the IEEE Journal of Solid State Circuits, Vol. SC. 6, No. 5, October 1971. In such a sensor, various signal adulterations are possible, including:

(a) If in the image recording the light releases charge carriers deep within the substrate, the danger exists that these charge carriers will diffuse to remote potential wells, whereby the image information will be adulterated.

(b) Another signal adulteration is smearing, which occurs if during read-out light continues to fall into the region beneath the row of electrodes. In this case, for example, all the charges which have been moved under a point exposed to bright light obtain a small additional quantity of charge.

(c) Another signal adulteration consists in blooming. Blooming occurs when the light produces more charge carriers than can be held in one potential well. The excess charge carriers then flow out of the potential well into adjacent potential wells and into potential wells of adjoining electrode rows.

The fault origin described at (a) above is avoided in an optical sensor of the type described above which is read out in a manner corresponding to a charge coupled transmission device, in that the layer thickness of the layer of doped semiconductor material is selected to be less than 10 μm. An optical sensor of this type is described in the publication "Carrier Diffusion Degradation of Modulation Transfer Function in Charge-Coupled Images" by D. H. Seib in the IEEE, Vol. ED-21, No. 3, 1974, pp. 210-217.

Smearing can be avoided by providing that the optical sensor is not read out in a manner corresponding to a charge coupled transmission device, but that the information charge carriers stored in the sensor are input in parallel into a charge coupled transmission device which is not accessible to the light, from where the charge carriers are withdrawn in a serial manner. Such an arrangement is described, for example, in the publication "Charge-Coupled Device Scanner Having Simultaneous Readout, Optical Scan and Data Rate Enahancement" by W. F. Bankowski and J. D. Tartamella in the IBM Technical Disclosure Bulletin, Vol. 16, No. 2, June 1973, pp. 173-174.

Blooming can be avoided in that, in addition to the electrode rows, overflow channels are arranged in the substrate, into which the excess charge carriers flow and from which they are discharged. An arrangement of this type is described, for example, in the publication "Blooming Suppression in Charge-Coupled Area Imaging Devices", by C. H. Sequin in the Bell System Technical Journal, October 1972, pp. 1923-1926.

SUMMARY OF THE INVENTION

The object of the present invention is to provide a sensor of the type generally described above in which it is possible to avoid the signal adulterations mentioned at (a), (b) and (c) above without the usual large additional expense involved.

The above object is realized in that the entire rear side of the thin layer of doped semiconductor material carriers at least one light permeable, electrically insulating layer, which layer is completely covered with a rear electrode consisting of a light-permeable, electrically conductive material.

It is expedient and advantageous if the thin layer of doped semiconductor material is electrically conductively connected to the rear electrode by way of a diode which, in the case of a n-doped thin layer, corresponds to a np-junction, and, in the case of a p-doped thin layer, corresponds to a pn-junction. Preferably, the diode and the electrically conductive connection between the thin layer and the rear electrode is formed in that at least one limited zone is arranged beneath the rear side of the thin layer, which zone is doped opposite to the doping of the thin layer and which is electrically conductively connected to the rear electrode by way of an ohmic contact through a contact hole in the electrically insulating layer.

Preferably, the thickness of the thin layer of doped semiconductor material is selected to be less than 10 μm.

In order to avoid the signal adulteration occurring as a deep diffusion corresponding to (a) above in the signal recording, the opto-electronic sensor constructed in accordance with the present invention is operated in such a manner that between the connection contact of the thin layer of doped semiconductor material and the rear electrode is connected a voltage which is such that a majority carrier depletion edge zone arises from the direction of the rear side. The sensor can here by illuminated from the row of electrodes or from the rear side. The spectral sensitivity of the sensor can hereby be varied.

It is known that long-wave light penetrates more deeply into the substrate than short-wave light. Therefore, in the case of a corresponding depletion edge zone leading from the rear side, when the exposure takes place from the row of electrodes, it is mainly the charge carriers produced by the short-wave light which accumulate and, in the case of exposure from the rear side, it is mainly the charge carriers produced by the long-wave light which accumulate. During read out in the former case, the charge carriers produced by the short-wave light are read out and, in the latter case, the charge carriers produced by the long-wave light are read out.

Smearing during transmission can be advantageously avoided in a sensor constructed in accordance with the present invention if the sensor is operated in such a manner that exposure is effected from the direction of the rear side, and that, during the read-out operation, a voltage is connected between the connection contact of the thin layer of doped semiconductor material and the rear electrode, which voltage is such that from the direction of the rear side a depletion edge zone is produced in the thin layer, the quantity of voltage being limited in that this depletion edge zone cannot be allowed to extend to the potential wells produced by the timing pulses on the row of electrodes.

Blooming is advantageously avoided in a sensor constructed in accordance with the present invention if the sensor is operated in such a manner that a voltage is connected between the connection contact of the thin layer of doped semiconductor material and the rear electrode, which voltage is such that from the direction of the rear side a depletion edge zone is produced which extends to the surface of the thin layer beneath the row of electrodes, and that during the image recording and during the transmission a voltage of equal polarity is connected between the connection contact of the thin layer and the electrodes of the row of electrodes.

The advantages of the invention are that all of the possibilities of signal adulteration can be avoided without a large circuitry outlay and merely by simple operating measures. In addition, the spectral sensitivity of the sensor can be varied.

BRIEF DESCRIPTION OF THE DRAWINGS

Other objects, features and advantages of the invention, its organization, construction and operation will be best understood from the following detailed description, taken in conjunction with the accompanying drawings, on which.

DESCRIPTION OF THE PREFERRED EMBODIMENTS

Figure 1:
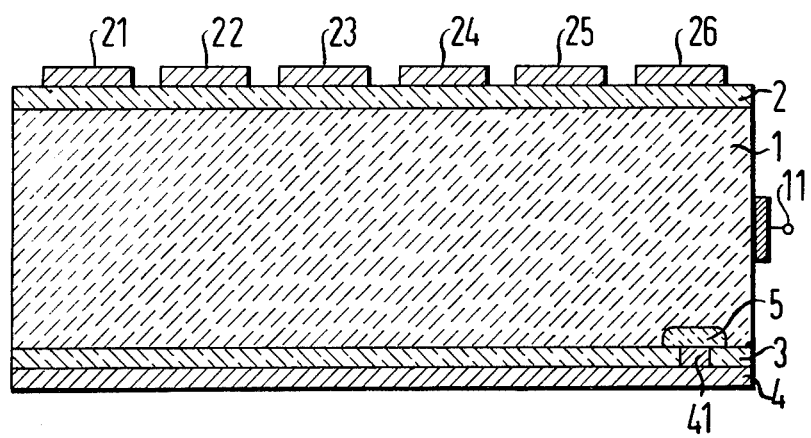
FIG. 1 is a cross sectional elevation of a sensor constructed in accordance with the present invention.

In FIG. 1, a light-permeable, electrically insulating layer 2 is arranged on a thin layer 1 of doped semiconductor material which preferably has a layer thickness of less than 10 $\mu$m. A row of electrodes 21-25, separated from one another by gaps, is carried on the layer 2 to form a charge coupled transmission device, as is well known to those versed in the art. Also arranged covering the entire rear side of the thin doped semiconductor layer 1 is a light-permeable, electrically insulating layer 3. Covering the entire rear surface of the light-permeable, electrically insulating layer 3 is a light-permeable electrode 4 composed of electrically conductive material. At least one connection contact 11 is carried by the thin layer 1 of doped semiconductor material. During operation, as will be explained in the following discussion, a depletion edge layer is constantly produced in the thin layer 1 from the direction of the rear electrode 4. Disturbing charge carriers are to be drawn off by this depletion edge layer. It is necessary that these charge carriers should be drawn off, as otherwise the charge carriers accumulate on the rear of the thin layer 1 and disintegrate the depletion edge layer. This process is best carried out by way of a suitably biased diode. In FIG. 1 this diode is constructed in a very simple manner in that, beneath the rear side of the thin layer 1 is arranged a limited zone 5, which is doped oppositely to the doping of the substrate and which is connected to the rear electrode 4 by way of an ohmic contact 41 extending through a contact hole in the insulating layer 3.

Figure 2:
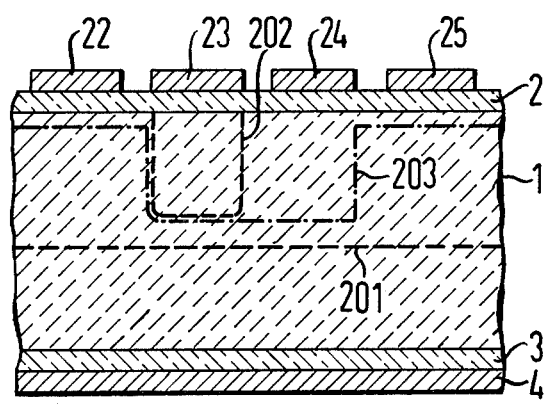
FIG. 2 is a cross sectional elevation of a portion of a sensor constructed in accordance with the present invention, specifically showing the local course of boundary lines of the depletion edge layers during operation in order to avoid diffusion.

In order to avoid signal adulterations due to diffusion during the image recording, beneath the rear electrode 4 and the thin layer 1 of doped semiconductor material a voltage is connected such that a depletion edge layer occurs in the thin layer 1 from the direction of the rear electrode. To this end, FIG. 2 illustrates a cross section of a portion of the sensor illustrated in FIG. 1. For example, a potential well is produced for the minority carriers produced by the light beneath the electrode 23 by connecting an appropriate voltage between the electrode 23 and the thin layer 1. Then, a depletion layer bounded by the broken line 202 exists beneath the electrode 23. A depletion edge layer which extends over the entire sensor surface and is bounded by the broken line 201 is also produced from the direction of the rear electrode 4. Here, it is advantageous for the depletion edge layer constructed from the direction of the rear electrode not to penetrate into the depletion edge layer beneath the electrode 23. The charge carriers released by the light within the depletion edge layer, constructed from the direction of the rear electrode, are now drawn off by way of the diode (1,5 FIG. 1) and do not travel into the depletion edge layer beneath the electrode 23. It is thus possible to largely avoid the signal adulteration as a result of diffusion of the charge to remote wells. It is immaterial whether the sensor is illuminated from the electrode row side or from the rear electrode side. However, a difference exists in the spectral sensitivity between the exposure from the direction of the electrode row side and the rear electrode side. It is known that longer wave light penetrates more deeply into the semiconductor material than does shorter wave light. If illumination is effected from the electrode row side, more charge carriers are produced beneath the surface by short-wave light than by long-wave light. More longer-wave light penetrates into the depletion edge layer produced from the rear electrode side, so that at that point more charge carriers are produced by longer-wave light than by short-wave light. As the charge carriers are drawn off in the depletion edge layer produced from the rear electrode side, predominately charge carriers which have been produced by short-wave light accumulate in the depletion edge zone beneath the electrode 23. Therefore, during the read-out operation, it is mainly charge carriers produced by short-wave light which are obtained. The conditions are precisely the reverse in the case of exposure from the direction of the rear electrode. The dash-dot line 203 in FIG. 2 provides merely one further possibility of setting the depletion zone constructed from the direction of the electrodes.

Smearing can be reduced during reading when exposure is effected from the direction of the rear electrode 4. To this end, FIG. 3 again illustrates a cross sectional elevation of the sensor illustrated in FIG. 1. During image recording, a relatively deep depletion edge layer is, in each case, produced, for example, beneath the electrodes 22 and 25. These two depletion edge zones are bounded by the broken lines 301 and 302, respectively. A relatively narrow depletion edge zone which extends over the entire sensor surface is produced from the direction of the rear electrode 4. This depletion edge zone is bounded by the broken line 303. Advantageously, this depletion edge zone is not to extend up to the depletion edge zones beneath the electrodes 22 and 25. The charge carriers which are produced by the light in the thin layer between the depletion zones can diffuse to the depletion zones beneath the electrodes 22 and 25. During reading, corresponding to the operation of the charge-coupled transmission device (see the above-mentioned publication) the electrodes 21-26 are connected with timing pulses which, beneath the electrodes, produce depletion zones which extend to a lesser depth beneath the surface of the thin layer 1. On the other hand, from the direction of the rear electrode, a depletion edge layer is produced which penetrates deeply into the thin layer 1. Here again, it is necessary to avoid an extension of this depletion edge zone into the depletion zones beneath the electrodes. All of the charge carriers produced in the depletion edge zone are drawn off and therefore do not influence the charge carriers in the depletion zones beneath the electrodes. The boundary of the depletion edge zone from the direction of the rear electrode during reading is indicated by the dash-dot line 304. The dash-dot lines 305 and 306 indicate the boundaries of the depletion zones beneath the electrodes which are produced by the timing pulses. Here, three-phase operation has been assumed, it being well understood by those skilled in the art that charge-coupled transmission devices can be operated, for example, in two-phase, three-phase and four-phase operation. Transmission devices for two-phase operation are generally constructed in such a manner that the electrodes of the row are alternately located, in the longitudinal direction of the row, on thinner and thicker insulating portions covering the substrate. Any transmission device and any mode of operation is suitable for the sensor, provided it is ensured that light-permeable points exist through which light penetrate into the layer of doped semiconductor material.

Figure 3:
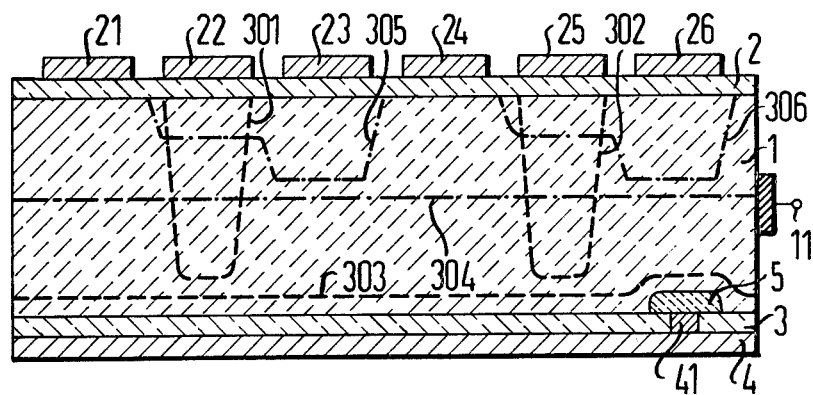
FIG. 3 is a cross sectional elevation of a portion of the sensor constructed in accordance with the present invention, having boundary lines of depletion edge layers during the image recording and during the read-out during operation in order to avoid smearing.
Figure 4:
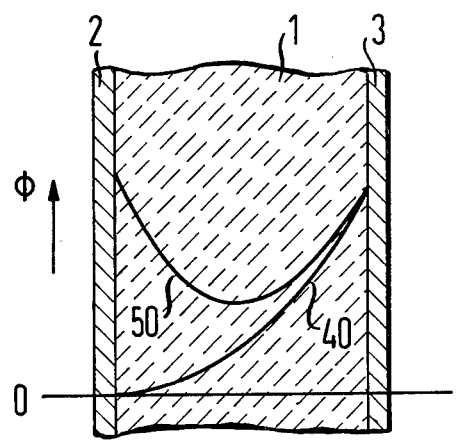
FIG. 4 is a diagram of the local course of the potential $\phi$ between the rear electrode and the electrodes of the row at right angles to the thin layer of doped semiconductor material.

In order to avoid blooming, a sufficiently high potential is connected to the rear electrode 4 to enable the depletion edge zone forming from the direction of the electrode 4 to extend to the surface of the thin layer of doped semiconductor material beneath the row of electrodes. The depletion zones which lie beneath the electrodes of the row of electrodes and which are required to enable the charge carriers to accumulate are produced in that a voltage of equal polarity is connected to these electrodes. To this end, FIG. 4 is a diagrammatic illustration of the local course of the potential $\phi$ between the rear electrode 4 and the electrodes of the row in the thin layer of doped semiconductor material at right edges to this layer. In FIG. 4 the curve 40 illustrates the local potential course for the event wherein the overlying electrode of the row of electrodes carries the potential of the thin layer of doped semiconductor material. The curve 50 indicates the local course for the event wherein the overlying electrode carriers a voltage of equal polarity. The depletion zones beneath the electrodes are separated, not by a neutral zone through which the charge carriers can diffuse, but by a depletion edge zone having a downwardly directed field. Excessively produced charge carriers are discharged to the rear of the device. Blooming and smearing can therefore be avoided in that, in the image recording, large depletion layers are provided beneath those electrodes under which the charge is accumulated, whereas in the case of the other electrodes, the depletion edge zone produced from the rear electrode penetrates to the surface of the thin layer beneath these electrodes. During reading, the depth of the depletion zones is reduced so that the smearing effect, as described with respect to FIG. 3, is virtually suppressed.

Although we have described our invention by reference to particular illustrative embodiments thereof, many changes and modifications of the invention may become apparent to those skilled in the art without departing from the spirit and scope of the invention. We therefore intend to include within the patent warranted hereon all such changes and modifications as may reasonably and properly be included within the scope of our contribution to the art.

We claim:

1. An opto-electronic sensor comprising: a thin layer of doped semiconductor material having a front surface and a rear surface and at least one electrical connection contact carried by said layer of doped semiconductor material; a first light-permeable, electrically insulating layer carried on said front surface of said thin layer of doped semiconductor material; at least one row of electrodes separated from one another by gaps and carried on said first insulating layer to form a charge-coupled transmission device; a thin second light-permeable, electrically insulating layer of constant thickness covering the entire rear surface of said thin layer of doped semiconductor material; and a light-permeable, electrically conductive electrode covering said second insulating layer; light incident on said thin layer which produces minority charge carriers; a potential applied to said thin layer and to at least a first electrode of said row of electrodes; a potential of one polarity applied to said electrically conductive electrode such that a depletion zone extends from said rear surface beneath said electrically conductive electrode to said front surface beneath said first electrode; a potential of said one polarity applied to at least a second electrode of said row of electrodes such that a potential well is formed in a depletion zone at said front surface beneath said second electrode in which said minority charge carriers are accumulated, the depletion zone beneath said second electrode extending to the depletion zone beneath said electrically conductive electrode.

2. An opto-electronic sensor as set forth in claim 1, comprising a diode electrically conductively connecting said thin layer of doped semiconductor material and said rear electrode.

3. An opto-electronic sensor as set forth in claim 2, wherein said thin layer is a n-doped layer and includes therein a p-doped element forming a np-junction.

4. An opto electronic sensor as set forth in claim 2, wherein said thin layer is a p-doped layer and includes therein an n-doped element forming a pn-junction.

5. An opto-electronic sensor as set forth in claim 2, wherein said second layer includes a hole therethrough, said thin layer is doped with one conductivity of dopant and includes a zone adjacent said hole having an opposite dopant, and comprising an ohmic contact extending through said hole and connecting said zone and said light-permeable, electrically conductive rear electrode.

6. An opto-electronic sensor as set forth in claim 1, wherein said thin layer of doped semiconductor material has a thickness of less than 10 $\mu$m.

* * * * *